United States Patent [19]
Lüdeke

[11] Patent Number: 5,864,234
[45] Date of Patent: Jan. 26, 1999

[54] IMAGE SYNTHESIZING METHOD FOR FORMING A COMPOSITE IMAGE FROM BASIC IMAGES

[75] Inventor: Kai-Michael Lüdeke, Hamburg, Germany

[73] Assignee: U.S. Philips Corporation, New York, N.Y.

[21] Appl. No.: 844,913

[22] Filed: Apr. 22, 1997

[30] Foreign Application Priority Data

Apr. 24, 1996 [DE] Germany ......................... 196 16 366.8
Sep. 7, 1996 [DE] Germany ......................... 196 36 469.8

[51] Int. Cl.$^6$ ................................................... G01V 3/00
[52] U.S. Cl. ............................................ 324/309; 324/307
[58] Field of Search ................................... 324/309, 307, 324/318, 322; 600/421, 422, 410

[56] References Cited

U.S. PATENT DOCUMENTS

| | | | |
|---|---|---|---|
| 5,394,087 | 2/1995 | Molyneaux | 324/318 |
| 5,399,970 | 3/1995 | Pelc et al. | 324/307 |
| 5,529,069 | 6/1996 | Andoh | 324/309 |
| 5,600,244 | 2/1997 | Jensen et al. | 324/309 |

FOREIGN PATENT DOCUMENTS

| | | | |
|---|---|---|---|
| 0635727A1 | 1/1995 | European Pat. Off. | G01R 33/565 |
| 03284240 | 12/1991 | Japan | A61B 5/055 |

OTHER PUBLICATIONS

"The NMR Phased Array" by P.B. Roemer et al, in Magnetic Resonance in Medicine, 16(2), Nov., 1990, Duluth, MN, pp. 192–225.

"Phased Array Detectors and an Automated Intensity–Correction Algorithm for High–Resolution MR Imaging of the Human Brain" by Lawrence L. Wald et al, in Magnetic Resonance in Medicine 34(3), Sep., 1995, Baltimore, MD, pp. 433–439.

"Surface Coil Intensity Correction using Homomorphic Filtering" by M. Fuderer et al, in Meeting of the Society of Magnetic Resonance, 1987, p. 266.

*Primary Examiner*—Louis Arana
*Attorney, Agent, or Firm*—Dwight H. Renfrew, Jr.

[57] ABSTRACT

An image synthesizing method and apparatus for forming a composite image from basic images with complex image values acquired by sensors having sensitivities which vary differently across the area to be imaged, includes the deviation of complex image values of the composite image from the image values of the basic images which have been weighted in dependence on the complex values of the sensitivity of the sensors. The complex sensitivity values are determined according to the invention in that the sensitivities of the sensors are estimated on the basis of the basic images themselves by determining the sensitivity of each sensor from the basic image acquired thereby.

17 Claims, 3 Drawing Sheets

IMAGE SYNTHESIZING METHOD FOR FORMING A COMPOSITE IMAGE FROM BASIC IMAGES

BACKGROUND OF THE INVENTION

1. Field of the Invention

The invention relates to an image synthesizing method for forming a composite image from one or more basic images, each of which is acquired by means of a respective sensor having a sensitivity which varies across the area to be imaged, the image values of the composite image being derived from the image values of the basic image, or basic images, weighted in dependence on the sensitivity.

2. Description of the Related Art

An image synthesizing method of this kind can be used notably for MR examinations intended to determine the nuclear magnetization distribution in an examination zone, the MR signals generated in the examination zone then being picked up by a plurality of surface coils which are distributed around the examination zone and whose data is first separately processed and converted into basic images. In comparison with an MR examination utilizing only one receiving antenna having a constant sensitivity across the entire area to be imaged, the advantage of an enhanced signal-to-noise ratio is thus achieved. However, the sensitivity of such surface coils is strongly dependent on the location, so that the basic images determined for the individual coils cannot be simply added so as to obtain a composite image which optimally reproduces the entire examination zone.

An image synthesizing method of the kind set forth is already known from an article by Roemer et al. in Magn. Reson. Med. 16, pp. 192–225 (1990); therein, a composite image is formed from a plurality of basic images in conformity with the relation $$P_{jk} = p^t_{jk} R^{-1} b^*_{jk} \quad (1)$$

Therein:

- $P_{jk}$ is a complex image value of the composite image for a pixel situated in row j and column k of the composite image,
- $p^t_{jk}$ is the transposed form of a column vector $p_{jk}$ which is composed of the complex image values of the individual basic images for the pixel jk
- $R^{-1}$ is the inverse of the so-called noise correlation matrix (called a "noise resistance matrix" in the article by Roemer), and
- $b^*_{jk}$ is the conjugate complex form of a column vector $b_{jk}$ which is composed of the values of the sensitivities of the individual sensors for the pixel jk.

However, the effect of the location-dependent sensitivity is still noticeable, in the image values $P_{jk}$ of the composite image thus calculated, so that the points jk in the composite image which are situated furthest from the individual sensors or coils have the lowest brightness. The effect of the location-dependency of the sensor sensitivities can be eliminated according to Roemer as follows:

$$P_{jk} = \frac{p^t_{jk} R^{-1} b_{jk}^*}{b^t_{jk} R^{-1} b_{jk}^*} \quad (2)$$

Therein, $b^t_{jk}$ is the transposed form of the sensitivity vector $b_{jk}$.

If this calculation rule is used in practice, a problem is encountered in that $b_{jk}$, or the sensitivity of the individual sensors, at the various pixels of the examination zone is not known.

EP-OS 695 947 describes an MR method in which the sensitivity of the individual surface coils is determined by means of an additional coil which has an approximately constant sensitivity for the entire examination zone. During temporally separated steps MR images are then formed for this coil on the one hand and for the surface coils on the other hand, a measure of the sensitivity of the surface coil in the relevant pixel being derived from the ratio of an image value of the additional MR coil to an image value of a surface coil for the same pixel. Using the complex values of the sensitivity and the image values of the basic images of the individual coils thus obtained, a synthesizing operation is performed in conformity with the equations given in the cited publication, thus forming a composite image from the basic images. It is a drawback, however, that an additional MR coil and additional measurements are required.

Knowledge of the spatial variation of the sensitivity is important also if a basic image picked up by a single sensor is to be reproduced in such a manner that the location-dependent sensitivity of this sensor does not become manifest as a location-dependent brightness difference.

SUMMARY OF THE INVENTION

Therefore, it is an object of the present invention to provide a method of the kind set forth in which the sensitivity can be reliably determined without using a separate sensor having a constant sensitivity across the examination zone and without additional measurements being required. This object is achieved according to the invention in that the spatial variation of the absolute value of the sensitivity of each sensor is derived from the basic image acquired thereby. Thus, according to the invention the sensitivity values are derived from the basic images by estimation or approximation.

There are various possibilities for the determination of the spatial variation of the absolute value of the sensitivity from the basic images by estimation.

According to one version of the method one possibility consists in determining the spatial variation of the absolute value of the sensitivity of each sensor by means of a rational approximation function whose coefficients are derived from the basic image of the relevant sensor in such a manner that they approximate the spatial variation of the image values of the basic image as well as possible.

However, in a preferred version of the invention a smooth enveloping surface of locally smaller curvature is constructed on the basic image, which enveloping surface is based on the locally highest image values and includes all locally lower image values, the spatial variation of the absolute value of the sensitivity of the sensor associated with the relevant basic image being derived from the values on the enveloping surface. This estimation of the absolute value of the sensitivity is based on the following considerations.

If the examination zone were to contain a uniform object which were conceived so that a maximum signal would occur everywhere, the sensor signals could be used to derive basic images whose spatial image value profile would correspond directly to the profile of the absolute value of the sensitivity. Real objects are not uniform, but they also contain some volume elements or voxels which produce a maximum signal which appears as a relative or absolute maximum in the image value profile of the basic image formed thereby. These maxima, irregularly distributed across the basic image, can be considered to be sparse samples of the sensitivity profile. A smooth enveloping surface which is based on such sparse samples and follows the variation of the other image values with a curvature which is locally as small as possible, like a smoothly stretched tarpaulin arranged on the sparse samples, provides an appropriate estimate of the sensitivity profile for the sensor wherefrom the relevant basic image is derived (i.e. a profile of the absolute value of the location-dependent sensitivity).

If the complex image values of the composite image are to be determined in conformity with equation (2), not only the complex image values must be known but also the complex values of the sensitivity; thus, in order to obtain an optimum composite image, not only knowledge of the absolute value of the sensitivity is required but also knowledge of its phase. In a preferred further version of the invention, therefore, the phase of the sensitivity is also estimated on the basis of the basic image, in that a) the spatial variation of the phase of the sensitivity is derived from the low-pass filtered complex basic image for the associated sensor, b) a complex value for the sensitivity is derived from the absolute value and the phase of the sensitivity of the individual sensors.

The estimation of the phase is based on the consideration that the phase in the basic image is determined on the one hand by the locally comparatively "slowly" varying phase of the sensitivity, but on the other hand also by the comparatively "fast" local phase variations stemming from the object or from noise. The fast local phase variations can be eliminated by appropriate low-pass filtering, so that only the spatial variation of the phase of the sensitivity remains in the low-pass filtered complex basic image. The absolute value and the phase of the sensitivity can thus be reliably given for each pixel in the examination zone and for each coil.

Even though other applications are also feasible, the method according to the invention is preferably used for an MR method in which a) at least one sequence which includes at least one magnetic RF pulse acts on an examination zone in the presence of a uniform, steady magnetic field, b) a number of MR signals is received by coils acting as sensors, c) for each coil a basic image, representing the nuclear magnetization distribution, is derived from the MR signals received by the relevant coil, d) complex values which characterize the location-dependent sensitivity of the coil are derived from the basic image of the coil, and e) composite images are derived from the image values of the basic images and the complex values of the coil sensitivity.

After the complex values of the sensitivity have been determined in conformity with the invention, they can be used, in conjunction with the image values of the basic images, to form a composite image as disclosed in the two previously cited documents. In a preferred version of the invention, however, the image values $P_{jk}$ of the composite image are calculated in conformity with the relation $$P_{jk} = \frac{p_{jk}^t R^{-1} b_{jk}^*}{b_{jk}^t R^{-1} b_{jk}^* + \sigma^2/(b_{jk}^t R^{-1} b_{jk}^*)} \quad (3)$$

where:

$P_{jk}$ is a column vector formed from the complex image values of the basic images for the same pixel (jk), $R^{-1}$ is the inverse noise correlation matrix, $B_{jk}$ is a column vector formed from the complex values of the sensitivity of the individual sensors at the same pixel (jk), and $\sigma$ is a constant.

If the value of $\sigma$ is suitably chosen, the second term in the denominator can be ignored for as long as at least one sensor has adequate sensitivity in the pixel jk. If the sensitivity of all sensors is inadequate in the relevant pixel, the second term in the denominator of the equation given for $P_{jk}$ prevents the noise from being intensified in the relevant pixel.

In a further version of the invention, the enveloping surfaces are constructed by means of an iteration method, consisting of at least two successive iteration steps, in that for each enveloping surface point a new value is calculated by forming a weighted mean of this point and the neighboring points on the enveloping surface, said new value being taken up in the enveloping surface, however, only if it is larger than the previous value, the neighboring points otherwise being increased by at the most the absolute value of the difference between the previous value and the new value, but not beyond the enveloping surface point. At the beginning of the iteration, the enveloping surface points can be preset by way of the absolute image values of the associated basic images. This non-linear filtering operation enables comparatively simple determination of the sensitivity profiles of the individual sensors.

The arithmetic required for this purpose can be reduced in a further version of the invention in that prior to the construction of the enveloping surfaces the number of pixels of the basic images is decimated by replacing a spatially coherent kernel of pixels by one pixel having a value corresponding to the largest image value within the kernel. The enveloping surface need then be determined only for a basic image of, for example 32×32 low-pass pixels instead of for a basic image containing 256×256 pixels, each low-pass pixel thus replacing 8×8 pixels of the basic image.

In a further version of the invention the real component of the image values is used for the formation of the composite image. If the real component of its image values are used (instead of their absolute value) for the formation of a composite image, the noise level is reduced in the image background and in the image areas of low signal-to-noise ratio.

An apparatus for carrying out the method according to the invention, including a) a magnet for generating a uniform, steady magnetic field in an examination zone, b) a gradient coil system for the spatial encoding of the nuclear magnetization in the examination zone by means of magnetic gradient fields, c) an RF coil system for generating RF pulses in the examination zone, d) a receiving coil system which includes a plurality of receiving coils for receiving MR signals from the examination zone, e) programmable processing means for generating MR basic images from the MR signals received by the receiving coil system and for deriving an MR composite image from the MR basic images while taking into account the complex, location-dependent sensitivity of the individual receiving coils, is characterized in that on each basic image there is constructed a smooth enveloping surface of locally smaller curvature which is based on the locally largest image values and includes all locally smaller image values, the spatial variation of the absolute value of the sensitivity of the sensor associated with the relevant basic image being derived from the values on the enveloping surface.

BRIEF DESCRIPTION OF THE DRAWING

The invention will be described in detail hereinafter with reference to the drawings. Therein.

DETAILED DESCRIPTION OF THE PREFERRED EMBODIMENTS

Figure 1:
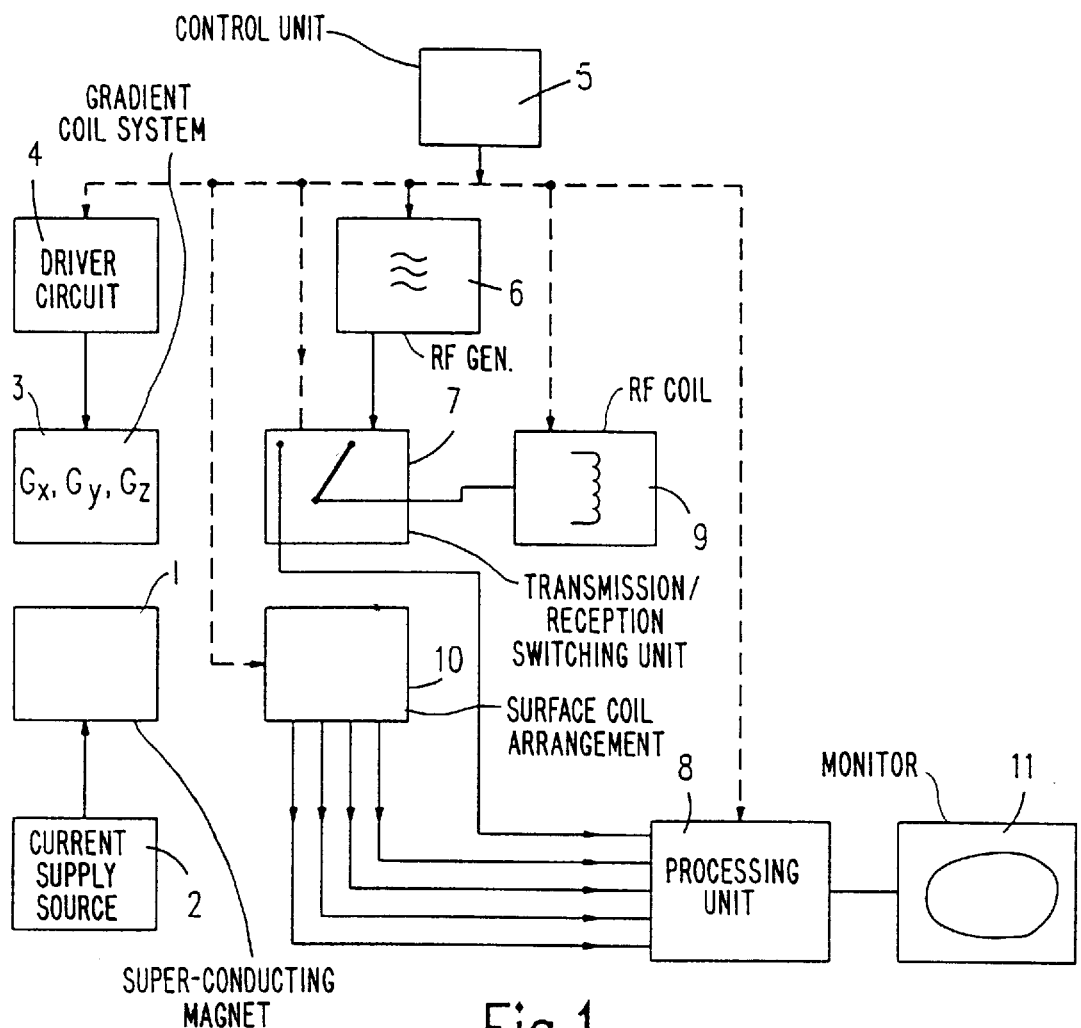
FIG. 1 is a block diagram of an MR examination apparatus which is suitable for carrying out the invention.

The reference numeral 1 in the circuit diagram of FIG. 1 denotes a preferably superconducting magnet which generates a steady, uniform magnetic field in an examination zone in which a patient can be arranged. The current required for this purpose is supplied by a current supply source 2. The reference numeral 3 denotes a gradient coil system for generating a magnetic gradient field which extends in the direction of the steady magnetic field and whose gradient extends in the same direction or in two directions which extend perpendicularly thereto and perpendicularly to one another. The currents required for this purpose are supplied by a driver circuit 4, the variation in time of the currents being controlled by a control unit 5 which can be implemented by means of a suitably programmed processor.

There is also provided an RF generator 6 which is capable of generating pulsed oscillations having the Larmor frequency of the spin system in the examination zone. A transmission/reception switching unit 7 connects a whole-body coil 9 optionally to a receiver and processing unit 8 or to the RF generator 6. The customary cylindrical whole-body coil encloses the body of the patient over a given length during an MR examination and generates an essentially uniform RF magnetic field in the patient. Furthermore, there is provided a surface coil system 10 which consists of a plurality of surface coils.

Figure 2:
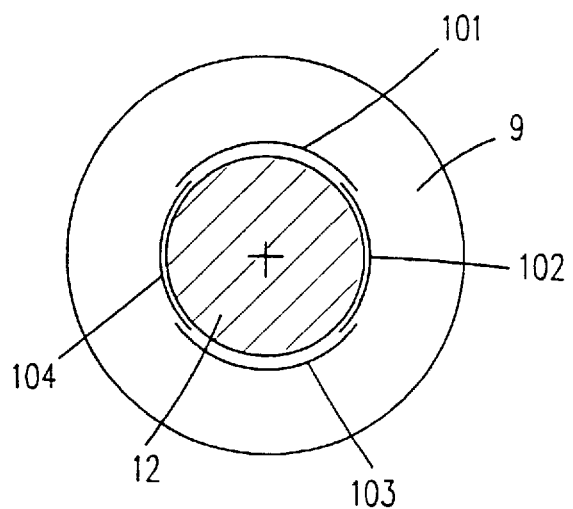
FIG. 2 shows diagrammatically the coil system used therein.

FIG. 2 shows the position in space of the whole-body coil 9 which may be, for example a coil of the bird-cage type but also a surface coil system consisting of a plurality (four in the present example) of separate surface coils 101 . . . 104. The four surface coils 101 to 104 can be provided on a flexible carrier (not shown) which is wrapped around a patient 12 to be examined. The coils are arranged on the carrier in such a manner that they overlap in a defined area, so that suitable decoupling is achieved between neighboring surface coils. The surface coils 101 . . . 104 have a locally inhomogeneous sensitivity, i.e. an MR signal arising at the center of the object 12 to be examined produces a current in the coils which deviates from that generated by an MR signal of the same magnitude which arises on the surface of the object to be examined.

Figure 3:
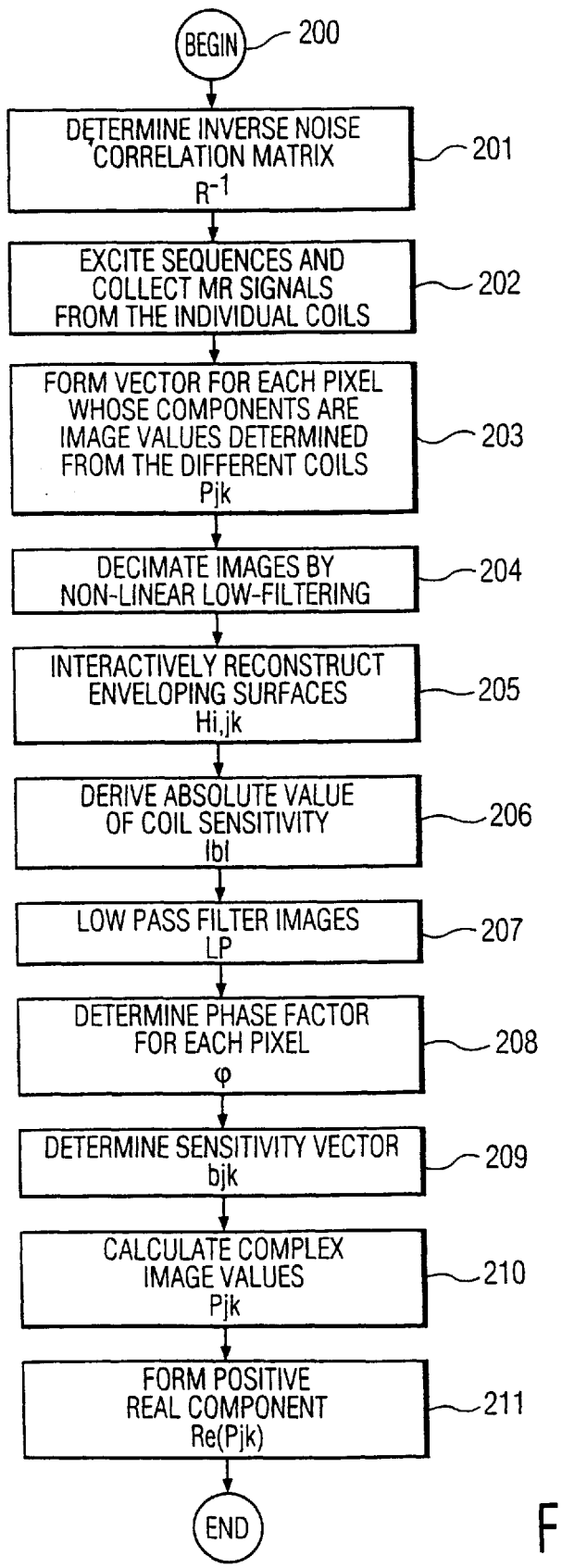
FIG. 3 shows a flow chart illustrating the processing steps required to form a composite image.

For each coil of the surface coil arrangement 10 (as well as for the whole-body coil 9) the unit 8 includes a respective channel in which the MR signal received by the relevant coil is amplified, demodulated in a phase-sensitive manner, and digitized. Because of the phase-sensitive demodulation, the digitized signal for each coil consists of a number of complex sampling values (characterized by absolute value and phase) wherefrom an MR basic image can be reconstructed separately for each coil, said basic image being composed of complex image values which are dependent on the nuclear magnetization distribution and on the sensitivity of the coil in the individual pixels. The receiving and processing unit 8 forms an MR composite image from the basic images produced by the individual surface coils, which composite image is displayed on a monitor 11. The foregoing procedure will be described in detail hereinafter with reference to the flow chart shown in FIG. 3.

Subsequent to the initialization (200), the noise correlation matrix, or the inverse noise correlation matrix $R^{-1}$, is determined during a first step 201. To this end, the signals generated in the examination zone are measured without RF pulses being generated by the RF coil 9 (FIG. 1) and without gradient fields being generated by the gradient coil system 3. The coefficients of the noise correlation matrix can be derived from these noise measurements by correlation of the various signals, said matrix being a square matrix which comprises as many columns and rows as there are coils present in the surface coil system.

The step 201 can be omitted if a noise correlation matrix has already been measured with the object to be examined. It may also be omitted in principle if it is accepted that the composite image derived from the MR basic images exhibits slightly more noise when the noise correlation matrix is not taken into consideration.

During the subsequent step 202 the nuclear magnetization in the examination zone is excited by sequences which include at least one RF pulse and is spatially encoded by magnetic gradient fields. The MR signals then received by the individual coils 101 . . . 104 are processed so as to form complex basic images. From the basic images thus obtained, for each pixel, defined by the row j and the column k, a vector $p_{jk}$ can be defined (step 203) in conformity with the equation:

$$p_{jk}=(P_{1,jk}, P_{2,jk}, \ldots P_{n,jk})^t \qquad (4)$$

Therein, $P_{1,jk} \ldots P_{n,jk}$ are the complex image values of the n basic images for the relevant pixel.

During the subsequent steps, the sensitivity of the individual coils in the individual pixels is estimated in respect of absolute value and phase. Various possibilities exist for the estimation of the absolute value of the sensitivity:

a) adaptation of suitable analytic 2D model functions for the sensitivity variation to the image values with a least-squares method, b) construction of smooth enveloping surfaces with locally smaller curvature on the basic images, so that the enveloping surfaces are based on locally highest image values and include all locally lower image values.

The following three approximation functions can be used for the method a):

a.1) The spatial variation of the image values $P_{i,jk}$ (where i indicates one of the n surface coils of the surface coil system 10) is approximated by means of a function $F_{i,jk}$ (step 204; the step 205 is omitted in the version according to a)) which is formed by inverse polynomials in conformity with the relation:

$$F_{i,jk} = \frac{1}{a_1 + a_2 j + a_3 k + a_4 j^2 + \ldots a_{15} k^4} \approx |P_{i,jk}|^{\frac{3}{4}} \qquad (5)$$

Therein, $a_1, a_2 \ldots a_{15}$ are the polynomial coefficients of a two-dimensional fourth-order polynomial of j and k. These polynomial coefficients are determined in conformity with the least-squares method, so that $F_{i,jk}$ approximates the image values $P_{i,jk}$ as well as possible in conformity with the equation (5). Subsequently, the sensitivity is calculated from the function $F_{i,jk}$ (step 206) in conformity with the relation:

$$|B_{i,jk}| := F_{i,jk}^{\frac{4}{3}}. \tag{6}$$

This is based on the following consideration.

As is known, the absolute value of the coil sensitivity decreases asymptotically as a function of the inverse of the third power of the distance. This is realized by equation (5) in conjunction with equation (6). For large values of j or k, the absolute value of the coil sensitivity changes as $1/j^3$ or $1/k^3$. Furthermore, during the excitation of a slice two sensitivity maxima appear in a plane extending perpendicularly to the surface coils, which maxima occur in the parts of the examination zone which are situated nearest to the conductors of the coil. This becomes manifest in the image values of the basic image which have a double maximum at these areas, that is if the spin density is high enough and homogeneous to some extent in the vicinity of the coil. Representation of a function with two maxima as a polynomial requires at least a fourth-order polynomial.

a.2) The above approximation of the absolute value of the coil sensitivity by the function $F_{i,j,k}$ is based on the consideration that the absolute value of the sensitivity in a slice extending perpendicularly to the plane of the surface coils can be approximated by a fourth-order two-dimensional polynomial. If the excited slice does not extend perpendicularly to the surface coils but sagitally or coronally with respect thereto, so that at least some of the conductors of the surface coils extend parallel to the slice, the variation of the coil sensitivity will be more complex and can then be approximated (step 204) by a function having a second-order polynomial in the numerator and a sixth-order polynomial in the denominator:

$$F_{i,jk} \equiv \frac{1 + b_1 j + b_2 k + \ldots + b_5 k^2}{a_1 + a_2 j + a_3 k + a_4 j^2 + \ldots a_{28} k^6} \approx |P_{i,jk}|^{\frac{3}{4}} \tag{7}$$

The absolute value of the coil sensitivity $|B_{i,jk}|$ can be derived therefrom in conformity with the equation (6) (step 206).

a.3) It has been found that the variation of the coil sensitivity can also be approximated by a function $F_{i,jk}$ in conformity with the relation:

$$F_{i,jk} \equiv a_1 + a_2 j + a_3 k + a_4 j^2 + \ldots a_{15} k^4 \approx \log |P_{i,jk}|^{\frac{3}{4}} \tag{8}$$

(step 204). The coil sensitivity can be calculated therefrom (step 206) in conformity with the relation:

$$|B_{i,jk}| := \exp(F_{i,jk}) \tag{9}$$

Satisfactory image synthesizing can thus be achieved, irrespective of the orientation of the slices relative to the surface coils.

b) The best results are obtained by means of the following enveloping surface construction method which is based on the assumption that the local (relative or absolute) maxima in the image value profiles correspond to sparse samples of the sensitivity profile.

Figure 4:
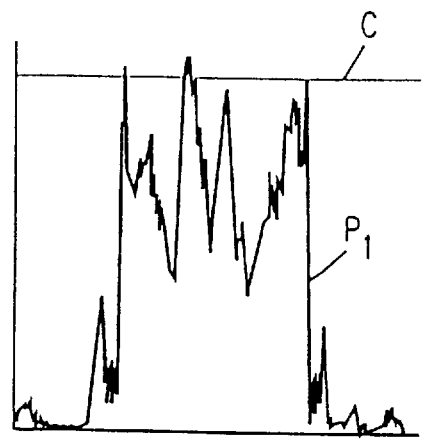
FIG. 4 shows an image value profile of a coil having a locally constant sensitivity.
Figure 5:
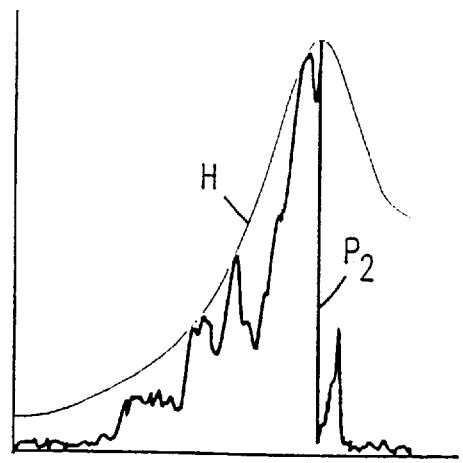
FIG. 5 shows an image value profile of a coil having a location-dependent sensitivity.

This will be illustrated hereinafter with reference to the FIGS. 4 and 5. FIG. 4 shows an image value profile along a straight line, for example extending in the row direction, for the basic image of a coil having a location-independent sensitivity, whereas FIG. 5 shows the image value profile of a basic image for a coil having a location-dependent sensitivity. The image value profile $P_1$ of FIG. 4 includes a plurality of approximately equally high maxima in the variation of the image values originating from voxels in the examination zone in which the MR signal is maximum. Therefore, the line C interconnecting these maxima is a measure of the sensitivity of the coil. In the image value profile $P_2$ of FIG. 5 the height of the maxima is dependent on their position to a comparatively high degree. If the enveloping surface H is based on these maxima as sparse samples and interconnects these sparse samples smoothly and with a minimum curvature, the enveloping surface H represents the spatial variation of the sensitivity profile of the coil whose MR signals were used to reconstruct the basic image having the image value profile $P_2$.

For the speed of calculation it is advantageous to decimate the number of pixels from, for example 256×256 to a lower value, for example 32×32, prior to the construction of the enveloping surface in step 204, by performing a non-linear low-filtering operation during which the largest image value is each time selected from the image values associated with a kernel of 8×8 pixels, said selected image value being associated with a low-pass pixel whose position and magnitude are defined by the pixels of the kernel. The local maxima of the basic images are thus preserved during this non-linear filtering operation.

In the step 205 the enveloping surfaces are then iteratively reconstructed for each of the previously decimated basic images, local low image values then quickly increasing towards the desired enveloping surface of small curvature, whereas the local maxima retain their original image value.

During this non-linear filtering operation a new value y is calculated for each point $H_{i,jk}$ on the enveloping surface in conformity with the relation:

$$\tilde{y} = \left( \frac{w \tilde{P}_{i,jk} + 2 \sum_{mn=1}^{8} H_{i,mn}}{16 + w} - H l_{i,jk} \right) \beta + H_{i,jk} \tag{10}$$

Therein, $\tilde{P}_{i,jk}$ is the image value in the decimated image which has been determined for the pixel jk in the basic image of the coil i; w is a weighting factor which is proportional thereto, but constant, and controls the linkage to the image value profile $P_2$ (FIG. 5); $H_{i,mn}$ are the enveloping surface values for the eight pixels surrounding the pixel defined by jk, and β is a relaxation factor which may be between 1 and 1.5. For the start of the iteration operation the enveloping surface values are set to be equal to the image values at the beginning.

If the newly calculated value y is larger than the enveloping surface value $H_{i,jk}$ thus far, it is taken up as the new enveloping surface value $H_{i,jk}$; otherwise, the enveloping surface values $H_{i,mn}$ of the neighboring pixels are increased by at the most the absolute value of the difference between the value thus far and the newly calculated value, but at the most to the value $\tilde{P}_{i,jk}$, i.e.: if $y > H_{i,jk}$, $H_{i,jk}$ is set to equal y. Otherwise it is attempted to increase the enveloping surface values $H_{i,mn}$ for the neighboring pixels by the difference $D = H_{i,jk} - y$. If $H_{i,mn} + D$ is smaller than $\tilde{P}_{i,jk}$, $H_{i,mn}$ is replaced by $H_{i,mn} + D$; otherwise the enveloping surface value $H_{i,mn}$ for the neighboring pixel is replaced by the image value $\tilde{P}_{i,jk}$ for the pixel jk at the center.

All pixels are thus treated during each iteration of the image values, the image values in the maxima retaining their value whereas they increase therebetween. The iteration can be terminated if the relative enveloping surface growth drops below a predetermined value. After the enveloping surface has thus been calculated for a defined number of pixels, a smoothing interpolation is performed, after which the enveloping surface has been calculated for exactly as many pixels as there were present in the basic image. The enveloping surface value $H_{i,jk}$ in the enveloping surface thus acquired suitably approximates the absolute value $|B_{i,jk}|$ of the sensitivity in the pixel jk of the coil whose image value profile was used to derive the enveloping surface.

The absolute values $|B_{i,jk}|$ of the sensitivity, as determined in the step 206 by means of the methods a.1, a.2, a.3 or b, are stored.

Subsequently, the phase of the sensitivity must still be determined. To this end, all basic images are subjected to a low-pass filtering operation (step 207). The kernel, or the zone across which averaging takes place during low-pass filtering, is chosen to be so large that noise and phase variations caused by the object are suppressed, but also so small that it can follow the phase imposed by the coil sensitivity. Approximately 10% of the linear image size is a target value which has proven to be satisfactory in practice. During the subsequent step 208, a phase factor $\epsilon$ is determined for each individual pixel in conformity with the relation:

$$e^{j\phi} \approx \frac{\hat{P}}{|\hat{P}|} \quad (11)$$

by dividing each complex image value $\hat{P}$ of this low-pass image by its absolute value.

Subsequently, the sensitivity of the individual coils in each pixel of the examination zone is known in respect of absolute value and phase, so that complex values for the sensitivity $B_{i,jk}$ can be formed therefrom by multiplying the absolute value $|B_{i,jk}|$, which can be derived from the enveloping surface, by the phase factor associated with the same pixel and the same coil. Thus, in the step 209 for each pixel jk in the examination zone a sensitivity vector $b_{jk}$ is defined in conformity with the relation $$b_{jk} = (B_{1,jk}, B_{2,jk}, \ldots B_{n,jk})^t \quad (12)$$

Therein, $B_{1,jk} \ldots B_{n,jk}$ are the complex sensitivity values of the coils 1 to n for the pixel jk.

The complex image values $P_{jk}$ of the composite image can then be calculated in conformity with the equation (3) (step 210). If necessary, this calculation can be simplified by replacing the noise correlation matrix by the unity matrix (the matrix elements on the principal diagonals then being 1 whereas all other matrix elements are 0), the equation (3) thus being simplified ultimately to:

$$P_{jk} = \frac{p_{jk}^t b_{jk}^*}{b_{jk}^t b_{jk}^* + \sigma^2/(b_{jk}^t b_{jk}^*)} \quad (13)$$

After the complex image values of the composite image have determined in this manner, the composite image is displayed on the monitor on the basis of these image values, for example in that for each pixel a brightness value corresponding to the absolute value of the image value is supplied. However, it is also possible to reproduce the positive real component instead of the absolute value as indicated in step 211 of the image value, so that the noise in the image background is reduced in the image areas having a low signal-to-noise ratio.

In the above example a composite image was derived from the basic images of a plurality of detectors. The invention, however, can also be used to derive an optimum image from a single basic image which has been picked up by a sensor, for example an MR coil. In the absence of image enhancement, the brightness of the basic image would be location-dependent in the same way as the sensitivity of the detector. This undesirable brightness variation can be eliminated by deriving the sensitivity of the sensor from the basic image in the same way as described above. The image values $P_{jk}$ for the individual pixels jk of the composite image, optimized in respect of brightness reproduction and noise, could then be calculated in conformity with the equation (13); the "vectors" $P_{jk}$ and $b_{jk}$ would then comprise only a single (complex) numerical value. If a higher noise in the image background can be tolerated ($\sigma=0$), the optimized basic image is obtained by pixel-by-pixel division of the image values of the basic image by the sensitivity. In special cases it may suffice to take into account only the absolute value of the sensitivity, so that in that case the determination of the phase (steps 207 and 208) could also be omitted.

I claim:

1. An image synthesizing method for forming a composite image from a plurality of basic images, each of which is acquired by means of a respective sensor having a sensitivity which varies across the area to be imaged, the image values of the composite image being derived from the image values of the the plurality of basic images, weighted in dependence on the sensitivity, characterized in that the spatial variation of the absolute value of the sensitivity of each sensor is derived from the basic image acquired thereby.

2. An image synthesizing method as claimed in claim 1, characterized in that it is used for an MR method, in which
   a) at least one sequence which includes at least one magnetic RF pulse acts on an examination zone in the presence of a uniform, steady magnetic field,
   b) a number of MR signals is received by a plurality of coils, each coil acting as a sensor,
   c) for each coil a basic image, representing the nuclear magnetization distribution, is derived from the MR signals received by the relevant coil, thereby deriving a plurality of basic images, one for each coil,
   d) the location-dependent sensitivity of each coil is derived from the basic image derived from that coil, and
   e) a composite image is derived from the image values of the plurality of basic images, and the coil sensitivity values determined.

3. An apparatus for carrying out the method claimed in claim 1, comprising:
   a) a magnet for generating a uniform, steady magnetic field in an examination zone,
   b) a gradient coil system for the spatial encoding of the nuclear magnetization in the examination zone by means of magnetic gradient fields,
   c) RF coil system for generating RF pulses in the examination zone,
   d) a receiving coil system which includes a plurality of receiving coils for receiving MR signals from the examination zone, and
   e) programmable processing means for generating MR basic images from the MR signals received by the receiving coil system and for deriving an MR composite image from the MR basic images while taking into account the complex, location-dependent sensitivity of the individual receiving coils, characterized in that the processing means are programmed in such a manner that on each basic image there is constructed a smooth enveloping surface of locally smaller curvature which is based on locally largest image values and includes all locally smaller image values, the spatial variation of the absolute value of the sensitivity of the sensor associated with the relevant basic image being derived from the values on the enveloping surface.

4. An image synthesizing method for forming a composite image from one or more basic images, each of which is acquired by means of a respective sensor having a sensitivity which varies across the area to be imaged, the image values of the composite image being derived from the image values of the basic image, or basic images, weighted in dependence on the sensitivity, wherein the spatial variation of the absolute value of the sensitivity of each sensor is derived from the basic image acquired thereby by a method in which a smooth enveloping surface of locally smaller curvature is constructed for each basic image on that basic image, which enveloping surface is based on the locally highest image values and includes all locally lower image values, the spatial variation of the absolute value of the sensitivity of the sensor associated with the relevant basic image being derived from the values on the enveloping surface.

5. An image synthesizing method as claimed in claim 4, characterized in that the enveloping surfaces are constructed by means of an iteration operation, consisting of at least two successive iteration steps, in that for each enveloping surface point a new value is calculated by forming a weighted mean value of this point and the neighboring points on the enveloping surface, said new value being taken up in the enveloping surface, however, only if it is larger than the previous value, the neighboring points otherwise being increased by at the most the absolute value of the difference between the previous value and the new value, but not beyond the image value at the beginning of the iteration operation.

6. An image synthesizing method as claimed in claim 5, characterized in that prior to the construction of the enveloping surfaces the number of pixels of the basic images is decimated by replacing a spatially coherent kernel of pixels by one pixel having a value corresponding to the largest image value within the kernel.

7. An image synthesizing method as claimed in claim 4, characterized in that prior to the construction of the enveloping surfaces the number of pixels of the basic images is decimated by replacing a spatially coherent kernel of pixels by one pixel having a value corresponding to the largest image value within the kernel.

8. An image synthesizing method as claimed in claim 7, characterized in that after their calculation for a decimated number of pixels, the enveloping surfaces are restored to the original number of pixels by a smoothing interpolation.

9. An image synthesizing method as claimed in claim 8, characterized in that after their calculation for a decimated number of pixels, the enveloping surfaces are restored to the original number of pixels by a smoothing interpolation.

10. An image synthesizing method for forming a composite image from one or more basic images, each of which is acquired by means of a respective sensor having a sensitivity which varies across the area to be imaged, the image values of the composite image being derived from the image values of the basic image, or basic images, weighted in dependence on the sensitivity, wherein the spatial variation of the absolute value of the sensitivity of each sensor is derived from the basic image acquired thereby by a method in which the spatial variation of the absolute value of the sensitivity of each sensor is determined by means of a rational approximation function ($F_{i,jk}$) whose coefficients are derived from the basic image of this sensor in such a manner that they approximate the spatial variation of the image values of the basic image.

11. The method of claim 10 wherein the rational approximation function is 1 divided by a two-dimensional fourth-order polynomial.

12. The method of claim 10 wherein the rational approximation function is a two-dimensional second-order polynomial divided by a two-dimensional sixth-order polynomial.

13. An image synthesizing method for forming a composite image from one or more basic images, each of which is acquired by means of a respective sensor having a sensitivity which varies across the area to be imaged, the image values of the composite image being derived from the complex image values of the basic image, or basic images, weighted in dependence on the complex values of the sensitivity, wherein the spatial variation of the absolute value of the sensitivity of each sensor is derived from the basic image acquired thereby and wherein the spatial variation of the phase of the sensitivity of each sensor is derived from the low-pass filtered complex basic image for the associated sensor, and the complex value for the sensitivity of each sensor is derived from the absolute value and the phase of the sensitivity of the individual sensors.

14. An image synthesizing method as claimed in claim 13, characterized in that the image values $P_{jk}$ of the composite image are calculated in conformity with the relation $$P_{jk} = \frac{p_{jk}^t R^{-1} b_{jk}^*}{b_{jk}^t R^{-1} b_{jk}^* + \sigma^2/(b_{jk}^t R^{-1} b_{jk}^*)}$$

where:

$P_{jk}$ is a column vector formed from the complex image values of the basic images for the same pixel (jk), $R^{-1}$ is the inverse noise correlation matrix, $b_{jk}$ is a column vector formed from the complex values of the sensitivity of the individual sensors at the same pixel (jk) and $\sigma$ is a constant.

15. An image synthesizing method as claimed in claim 14, characterized in that the positive real component of the image values is used for the formation of the composite image.

16. An image synthesizing method as claimed in claim 13, characterized in that a smooth enveloping surface of locally smaller curvature is constructed on the basic image, which enveloping surface is based on the locally highest image values and includes all locally lower image values, the spatial variation of the absolute value of the sensitivity of the sensor associated with the relevant basic image being derived from the values on the enveloping surface.

17. An image synthesizing method as claimed in claim 13, characterized in that the spatial variation of the absolute value of the sensitivity of each sensor is determined by means of a rational approximation function whose coefficients are derived from the basic image of this sensor in such a manner that they approximate the spatial variation of the image values of the basic image as well as possible.

* * * * *